United States Patent
Hibino et al.

[11] Patent Number: 6,018,122
[45] Date of Patent: Jan. 25, 2000

[54] TRACKING SOLAR MODULE

[75] Inventors: Kouetsu Hibino, Nissin; Kyoichi Tange, Mishima; Tomonori Nagashima, Susono, all of Japan

[73] Assignee: Toyota Jidosha Kabushiki Kaisha, Japan

[21] Appl. No.: 08/812,362

[22] Filed: Mar. 5, 1997

[30] Foreign Application Priority Data

Mar. 11, 1996 [JP] Japan ................................. 8-053073

[51] Int. Cl.$^7$ ............................................. H01L 31/052
[52] U.S. Cl. .................. 136/246; 136/259; 126/600; 126/601; 126/605; 126/573; 126/574; 126/576; 126/634; 126/639; 126/678; 126/679; 126/698; 126/701; 250/203.4
[58] Field of Search ..................... 136/246, 259; 126/573, 600, 634, 639, 678, 698, 701, 574, 576, 601, 605, 679; 250/203.4

[56] References Cited

U.S. PATENT DOCUMENTS

| Re. 30,584 | 4/1981 | Russell | 136/246 |
|---|---|---|---|
| 4,052,228 | 10/1977 | Russell | 136/246 |
| 4,081,289 | 3/1978 | Campbell, III | 136/246 |
| 4,143,233 | 3/1979 | Kapany et al. | 136/246 |
| 4,304,955 | 12/1981 | Meckler | 136/259 |

FOREIGN PATENT DOCUMENTS

| 27 49 992 | 5/1979 | Germany . |
|---|---|---|
| 28 47 433 | 5/1980 | Germany . |
| 55-60152 | 5/1980 | Japan . |
| 59-58959 | 4/1984 | Japan . |
| 64-13502 | 1/1989 | Japan . |
| 5-332636 | 12/1993 | Japan . |

OTHER PUBLICATIONS

"The Design And Performance Of Liquid Filled Stationary Concentrators For Use With Photovoltaic Cells", I. R. Edmonds et al., Solar Energy vol. 39, No. 2, 1987, pp. 113–122 (month unknown).

German Office Action dated May 25, 1999 (4 pages).

*Primary Examiner*—Alan Diamond
*Attorney, Agent, or Firm*—Finnegan, Henderson, Farabow, Garrett & Dunner, L.L.P.

[57] ABSTRACT

To provide a tracking-type solar module capable of high-performance sunlight-tracking with a simple configuration while simultaneously performing highly effective cooling of a solar cell, a solar cell is movably installed within a transparent cooling tube and is connected to a motor with a crank. A position detecting sensor is also installed inside the transparent cooling tube. Sunlight is refracted by a cooling medium filled inside the transparent cooling tube and is converged on the inner surface of the transparent cooling tube. The position detecting sensor detects the position at which sunlight is converged and the sunlight is tracked by the motor moving the solar cell to that position. Simultaneously, the cooling medium inside the transparent cooling tube directly cools the solar cell.

7 Claims, 13 Drawing Sheets

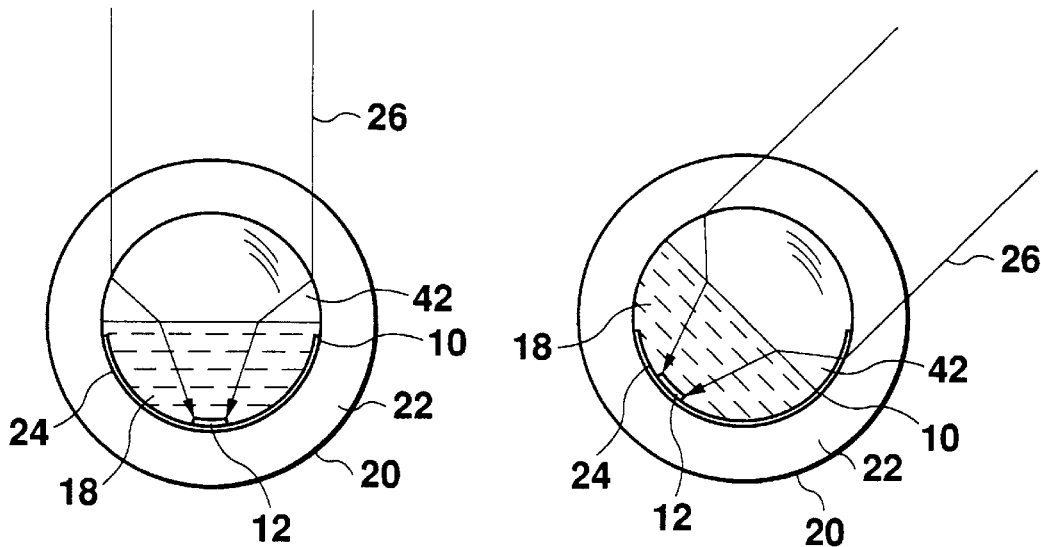
Fig. 8a     Fig. 8b
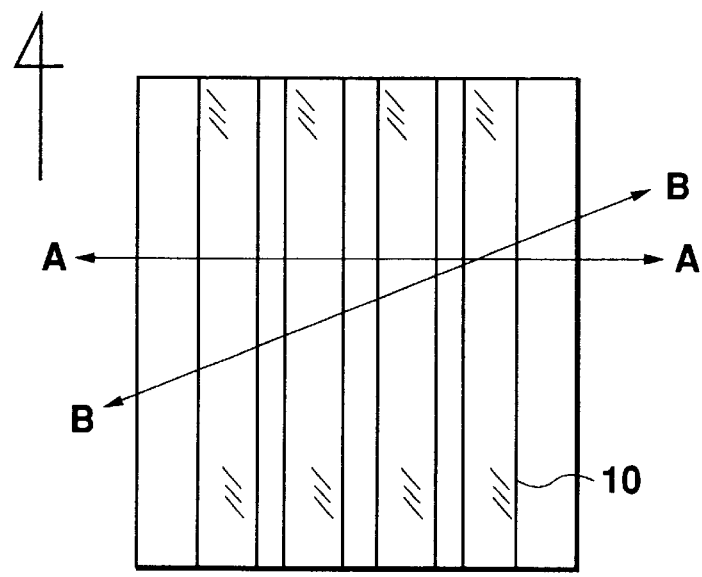
Fig. 9

TRACKING SOLAR MODULE

BACKGROUND OF THE INVENTION

1. Field of the Invention

The present invention relates to improvements to a tracking-type solar module for generating power while tracking sunlight.

2. Description of the Related Art

Since solar cells are generally expensive, converging solar modules have previously been suggested in order to reduce costs. Such converging solar modules must track the changes in sunlight at each moment and move a solar cell in compliance with the position of the sunlight while receiving the sunlight.

FIG. 16 depicts the movement of the sun during a single day as well as changes in the sun's orbit for each season. As the diagram shows, the sun moves through a variety of positions depending on time and season. A system is already known using programmable tracking for tracking the sun as it moves wherein tracking speed and such like are calculated beforehand in accordance with the sun's movements, and the sun is tracked along a path determined based on these calculations.

However, such programmable tracking has a disadvantage that a high degree of accuracy is required for setting the compass points and the horizontal level when installing the solar cell.

As a result, there is a problem that errors accumulate over a long period of use. There is also a problem that lines become complex when controlling unequal speeds.

A sensor-system tracking has therefore been proposed for detecting the position of the sun by means of a sensor and carrying out tracking based on a position detection signal from this sensor. Since no errors are accumulated when a sensor system is used, tracking with a high degree of accuracy can be achieved relatively easily without the prerequisite of high accuracy during installation.

Conventional converging solar modules track the sun using the system described above while converging sunlight with a lens, thereby reducing the working area of the solar cell and lowering costs.

However, when sunlight is converged in this manner, there is the problem that the temperature of the solar cell rises, reducing power generation efficiency. The solar cell must therefore be cooled to lower the temperature. A cooling method for a solar cell such as this was disclosed in Japanese Patent Laid-Open Publication No. Hei 5-332636. This method, whereby a solar cell is cooled indirectly with a cooling medium through an insulating film, constitutes related art of the present publication.

However, the above-mentioned system had the disadvantage that, since the cooling of the solar cell with a cooling medium is not performed directly but indirectly through an insulating film, adequate cooling effect cannot be obtained when the convergence level is increased.

An additional problem is that, when the sensor system described above is used for tracking the sun, errors are liable to occur as when, for instance, sunlight is obscured by clouding.

SUMMARY OF THE INVENTION

The present invention has been designed to solve the problems described above and aims to provide a tracking-type solar module capable of high-performance sunlight-tracking with a simple configuration while simultaneously performing highly effective cooling of a solar cell.

An aspect of the invention is a tracking-type solar module for generating power while tracking the sun, comprising a transparent cooling tube permeable to sunlight, a solar cell movably installed inside this transparent cooling tube, a cooling medium contained within the transparent cooling tube for directly cooling the solar cell while also functioning as a lens for converging sunlight and having a refractive index such that sunlight is converged inside the transparent cooling tube, a position detecting sensor for detecting the position of sunlight converged by the cooling medium and a driving device for moving the solar cell to the sunlight-converging position in accordance with a signal from the position detecting sensor.

Furthermore, an aspect of the invention is a tracking-type solar module of the second aspect of the invention wherein the transparent cooling tube is cylindrical.

Furthermore, an aspect of the invention is a tracking-type solar module of the second aspect of the invention wherein the transparent cooling tube is spherical.

Furthermore, an aspect of the invention is a tracking-type solar module of the second aspect of the invention wherein a lens is installed within the transparent cooling tube and the refractive index of the cooling medium is combined with the lens so that sunlight is converged inside the transparent cooling tube.

Furthermore, an aspect of the invention is a tracking-type solar module of the third aspect of the invention wherein the solar cell is arranged in the axial direction of the transparent cooling tube and can be positioned at a designated angle with respect to the axis of the transparent cooling tube.

Furthermore, an aspect of the invention is a tracking-type solar module of the fourth aspect of the invention wherein a driving device has a magnet positioned on the outside of the transparent cooling tube and the solar cell is moved to a sunlight-converging position by movement of this magnet.

Furthermore, an aspect of the invention is a tracking-type solar module of the second aspect of the invention which has a light sensor on the outside of the transparent cooling tube and, based on the amount of light received by this sensor and the amount of light received by a position detecting sensor, sunlight is tracked only when the amount of sunlight exceeds a designated amount.

BRIEF DESCRIPTION OF THE DRAWINGS

FIGS. 8(a), (b) are cross-sectional views of the VIII—VIII section of the tracking-type solar module depicted in FIG. 7.

FIG. 9 is a diagram explaining an orbit of the sun.

DESCRIPTION OF THE PREFERRED EMBODIMENTS

The preferred embodiments of the present invention will next be explained based on the diagrams.

Embodiment 1

Figure 1:
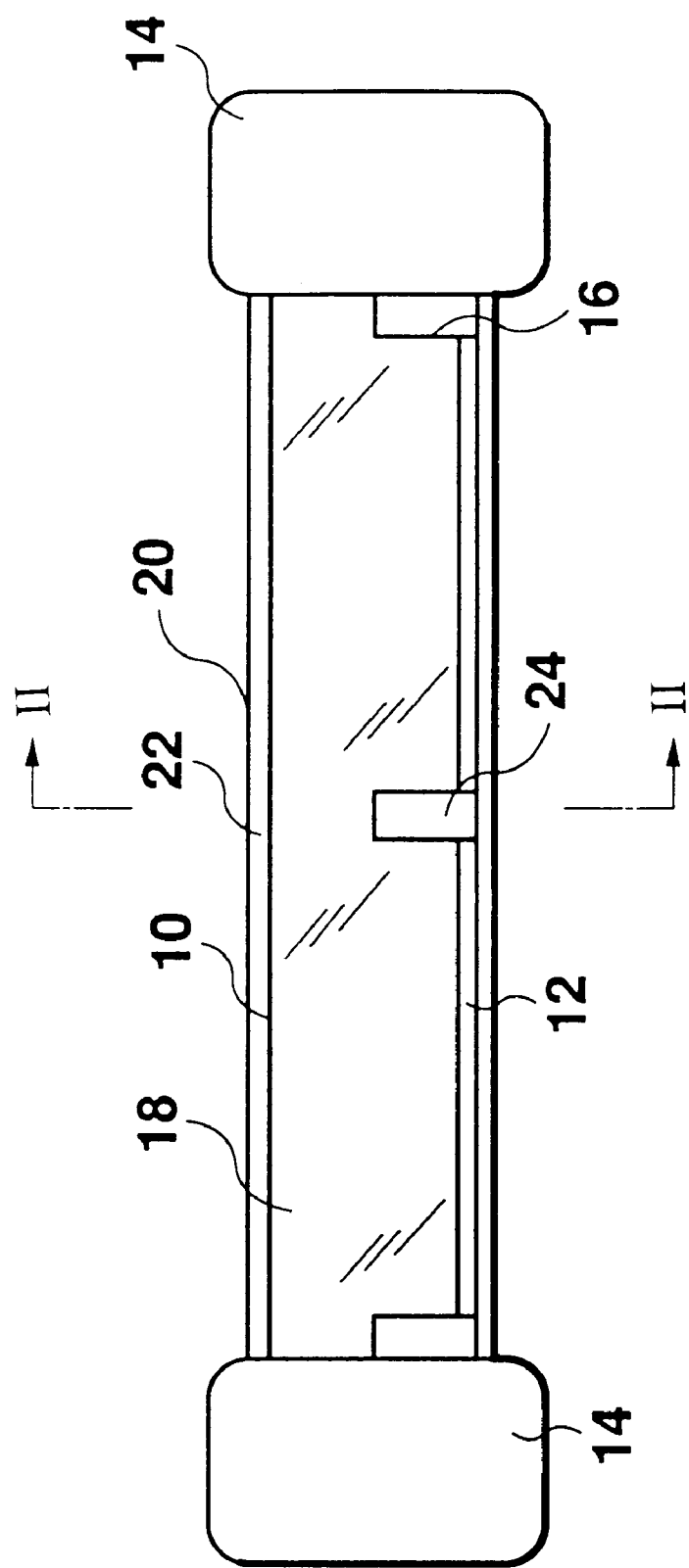
FIG. 1 is a side view of a first embodiment of a tracking-type solar module of the present invention.

FIG. 1 shows a side view of a first embodiment of a tracking-type solar module of the present invention. In the diagram, a solar cell 12 is provided inside a transparent cooling tube 10 formed from transparent material permeable to sunlight. A motor 14 for moving the solar cell 12 is provided at both ends of the transparent cooling tube 10 and this motor 14 is connected to the solar cell 12 by a crank 16. The solar cell 12 is moved along the inside of the transparent cooling tube 10 by a driving device consisting of the motor 14 and the crank 16. The interior of the transparent cooling tube 10 is filled with a cooling medium 18 which directly cools the surface (light-receiving surface) of the solar cell 12.

In addition, the transparent cooling tube 10 is contained within a vacuum preserving tube 20 formed from material permeable to sunlight and the space between the transparent cooling tube 10 and the vacuum preserving tube 20 consists of a vacuum region 22 for improving heating insulation. Furthermore, a position detecting sensor 24 for detecting the position of the sunlight is provided to a portion of the region across which the solar cell 12 moves on the inner surface of the transparent cooling tube 10.

Figure 2A:
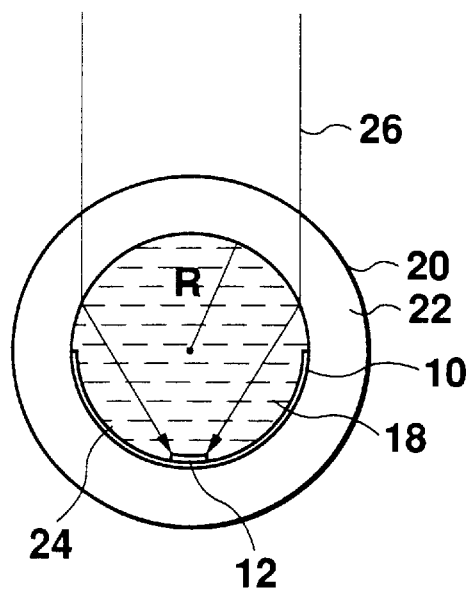
FIGS. 2(a), (b) are a cross-sectional view and a top view of the II—II section of the tracking-type solar module depicted in FIG. 1.

FIG. 2(a) shows a cross-sectional view of the II—II section of the tracking-type solar module depicted in FIG. 1. Since the cross-section at FIG. 2(a) is circular, the transparent cooling tube 10 of the tracking-type solar module depicted in FIG. 1 is cylindrical.

Because the transparent cooling tube 10 is cylindrical, incoming sunlight 26 here is refracted by the cooling medium 18 filled inside and is converged at a designated portion within that transparent cooling tube 10. In other words, the transparent cooling tube 10 filled with the cooling medium 18 functions as a lens.

Since the transparent cooling tube 10 is cylindrical as described above, when the radius of the tube is expressed as R and the refractive index of the cooling medium 18 as n, the focal distance can be determined from the lens formula:

$$f = R/(n-1)$$

For this calculation it is assumed that the transparent cooling tube 10 functions as a semi-cylindrical lens, not a cylindrical lens, and that the focal point is within the cylinder.

For example, when refractive index n=1.5, focal distance f=2R and when parallel light enters, sunlight 26 is converged on the perimeter of the transparent cooling tube 10. The entry angle of the sunlight 26 changes according to changes in the sun's position but here it is considered to be parallel light. Therefore, sunlight 26 is converged on the perimeter regardless of the sun's position.

Figure 2B:
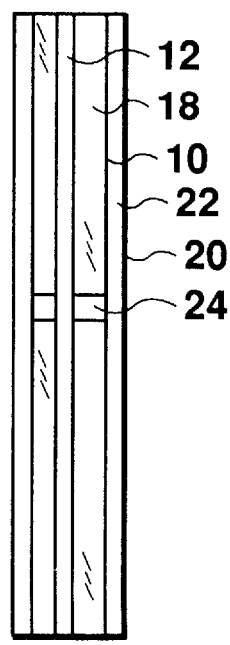

FIG. 2(b) shows a top view of the tracking-type solar module depicted in FIG. 1. In FIGS. 2(a), (b) the transparent cooling tube 10 is provided with a position detecting sensor 24 for detecting the position at which sunlight 26 converges as described above. A driving device consisting of the motor 14 and crank 16 shown in FIG. 1 moves the solar cell 12 to the light-conversing position detected by the position detecting sensor 24. As FIGS. 1 and 2(a), (b) show, a position detecting sensor 24 is provided approximately halfway along the lower portion of the transparent cooling tube 10.

Figure 4:
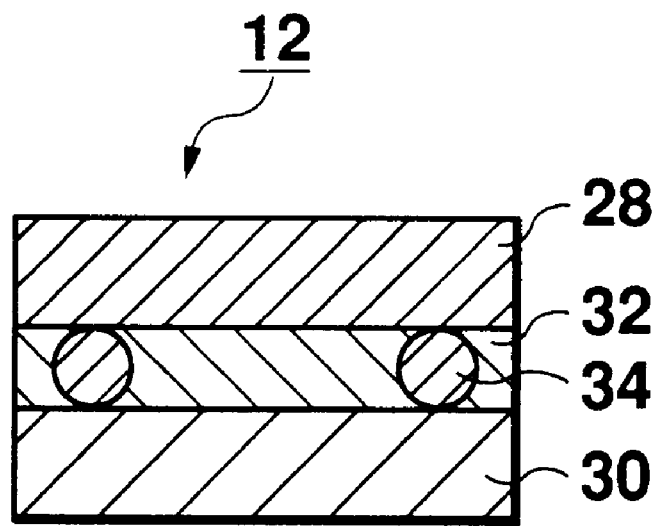
FIG. 4 is a cross-sectional diagram of a solar cell used in the tracking-type solar module depicted in FIG. 1.

FIG. 4 shows a cross-section of the above-mentioned solar cell 12. In this diagram, a solar cell layer 28 consisting of a pn junction which forms the solar cell is provided on the uppermost portion of solar cell 12. This solar cell layer 28 is cemented to a support board 30 by means of an adhesive 32. In addition, as described above, a cooling medium 18 directly cools the surface of the solar cell layer 28 which receives the sunlight. Therefore, in order to prevent corrosion, the leads 34 for extracting electric power from the solar cell layer 28 all extend from the rear of the solar cell layer 28 to ensure that they do not make contact with the cooling medium 18. As FIG. 4 shows, these leads 34 extend through the layer of adhesive 32 to the exterior and are thus secured by the adhesive 32. Enveloping the leads 34 in the adhesive 32 in this way prevents them from making contact with the cooling medium 18.

Figure 5:
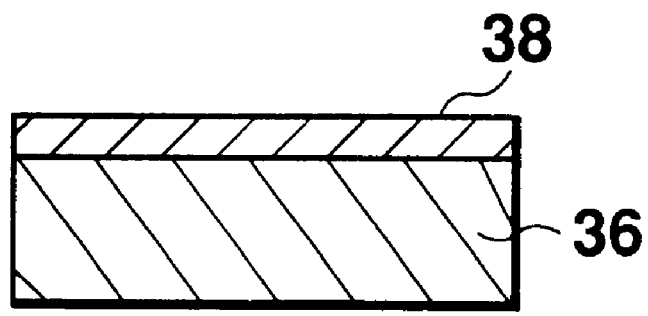
FIG. 5 is a cross-sectional diagram of a position detecting sensor used in the tracking-type solar module depicted in FIG. 1.

FIG. 5 shows a cross-section of the above-mentioned position detecting sensor 24. In this diagram, the upper surface of light sensor 36 is coated with a dimming filter 38 in order to prevent saturation of the detection level of the light sensor 36 caused by light from scattered rays of sunlight and aberration entering the position detecting sensor 24 in FIG. 2(a) along with light gathered by the cooling medium 18.

The portion of light sensor 36 corresponding to the lower side of the solar cell 12 receives no light when the solar cell 12 is completely receiving sunlight since the sunlight is resultantly obscured. Therefore, when a visible-light sensor is used as the light sensor 36, sunlight can be tracked by adjusting the position of the solar cell 12 using the motor 14 to ensure that the position detecting sensor 24 is not exposed to sunlight.

Furthermore, when an infrared sensor is used as the light sensor 36, since the infrared rays in the sunlight permeate through the solar cell 12, sunlight can be tracked using the same method as described above by detecting these infrared rays with the infrared sensor and moving the solar cell 12 to the portion at which the infrared rays are being detected.

The operation of a tracking-type solar module of the present embodiment will next be explained.

Figure 6:
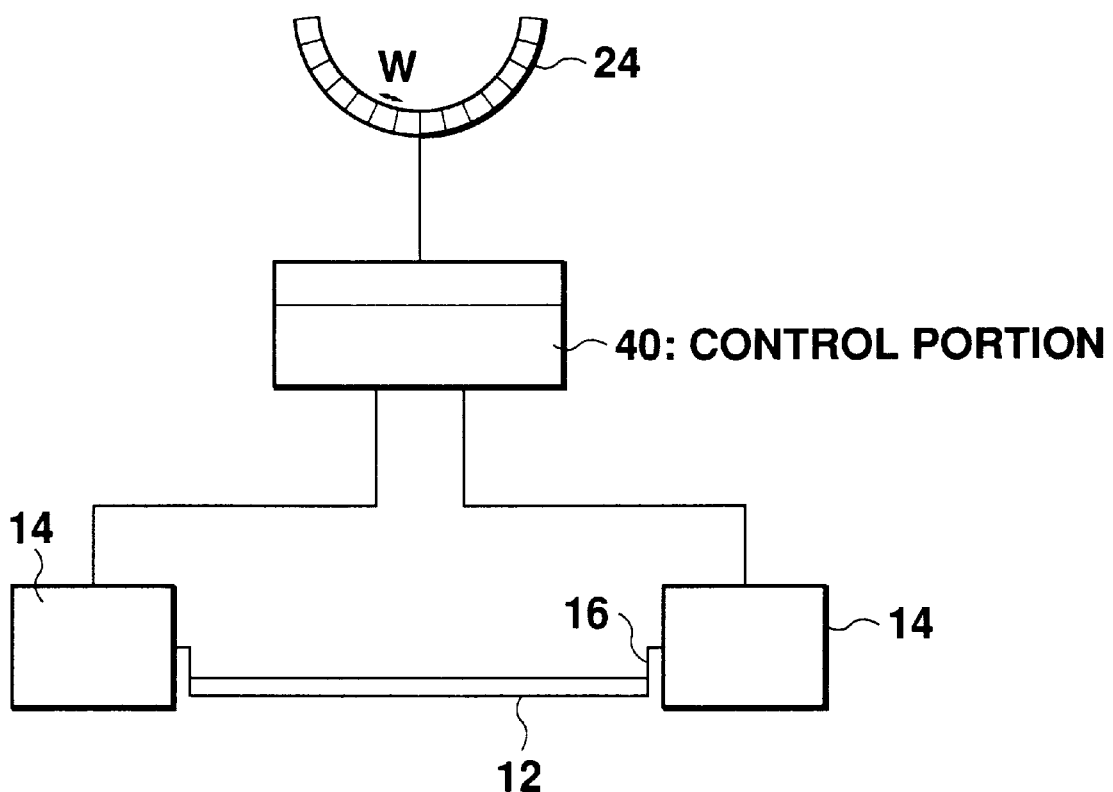
FIG. 6 is a block diagram showing position controlling configuration for a solar cell in the tracking-type solar module depicted in FIG. 1.

FIG. 6 shows a block diagram of a position controlling mechanism for a solar cell 12. In this diagram, when sunlight strikes a specific position of the position detecting sensor 24, the position detecting sensor 24 sends data defining the position at which the sunlight is striking to a control portion 40. Based on the data from the position detecting sensor 24, the control portion 40 controls the motor 14 to move the solar cell 12 to the portion at which the sunlight is striking. Based on a signal from the control portion 40, the motor 14 uses the crank 16 to move the solar cell 12 to match the position of the sunlight.

As FIG. 2(a) shows, when sunlight 26 enters from directly above the transparent cooling tube 10, this sunlight 26 strikes the position detecting sensor 24 approximately in the center and the control portion 40 therefore drives the motor 14 to move the solar cell 12 to that position.

Figure 3A:
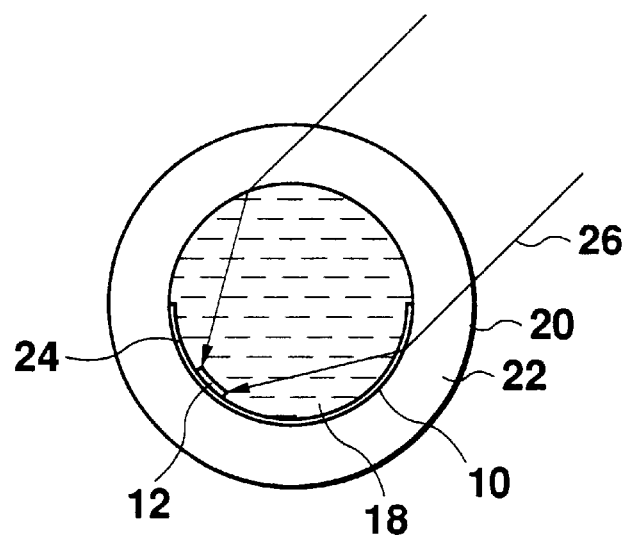
FIGS. 3(a), (b) are a cross-sectional view and a plane view of the II—II section of the tracking-type solar module depicted in FIG. 1 when the position of the solar cell has moved.
Figure 3B:
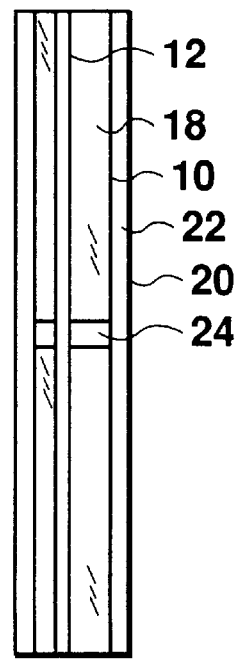

Alternatively, when sunlight 26 enters from the top right as shown in FIG. 3(a), the position of sunlight converged by the cooling medium 18 filled within the transparent cooling tube 10 is further to the left side than was the case in FIG. 2(a). The position detecting sensor 24 therefore informs the control portion 40 of the movement of the sunlight 26 converging position and the control portion 40 drives the motor 14 to move the solar cell 12 to the sunlight 26 converging position as shown in FIGS. 3(a) and (b).

With the above operation, even when the position of the sun changes over time, the sun can be tracked by moving the position of the solar cell 12. Since the solar cell 12 moves above the position detecting sensor 24, the resolution for the movement of the solar cell 12 of the position detecting sensor 24 should preferably be equal to or higher than the width of the solar cell 12. For example, when the position detecting sensor 24 is divided into a plurality of sections and sunlight is detected in these section units as shown in FIG. 6, the width W of each section should preferably be equal to or narrower than the width of the solar cell 12.

In the present embodiment the transparent cooling tube 10 and the vacuum preserving tube 20 are cylindrical, but they are not restricted to this shape. Provided that the configuration is such that the solar cell 12 can move within the transparent cooling tube 10 and sunlight 26 is converged close to the movement path of the solar cell 12, there is no restriction on the shape of the tubes.

Furthermore, although two motors 14 were provided to form the driving device depicted in FIG. 1, one motor 14 is sufficient.

Embodiment 2

Figure 7:
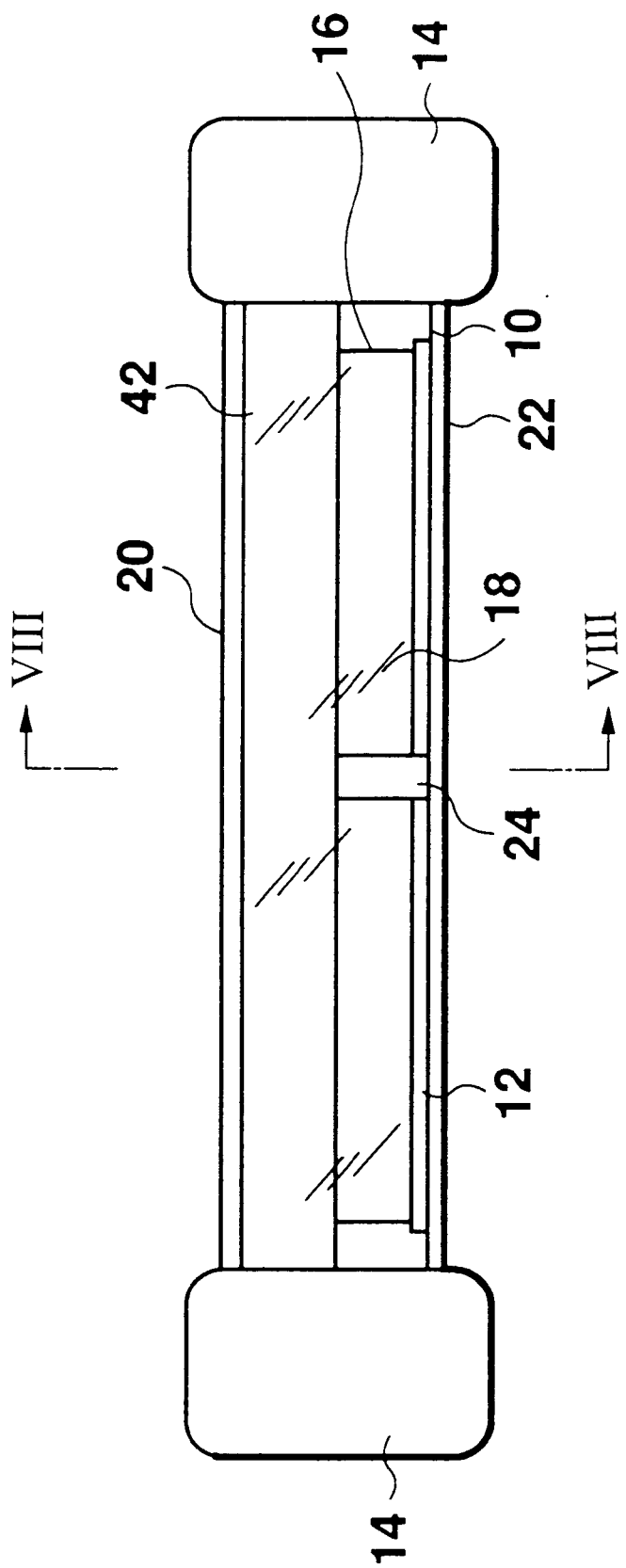
FIG. 7 is diagram showing a side view of a second embodiment of a tracking-type solar module of the present invention.

FIG. 7 shows a side view of a second embodiment of a tracking-type solar module of the present invention. FIG. 8(a) and (b) show cross-sectional views of the VIII—VIII section of FIG. 7 with the same numbering for the same portions already depicted in FIGS. 1 and 2, respectively.

In this embodiment, since water with a refractive index of 1.33 is used as the cooling medium 18, the equation here is:

$$f=R/(n-1)=3R$$

Consequently, sunlight 26 is not converged inside the transparent cooling tube 10. Therefore, in the present embodiment, a single lens or a plurality of lenses is/are used in order to converge sunlight within the transparent cooling tube 10.

As FIG. 7 shows, a lens 42 is provided directly above the solar cell 12 and is secured to a motor 14 together with the solar cell 12 by a crank 16. As a result, the solar cell 12 and the lens 42 are rotated together by the motor 14.

FIGS. 8(a) and (b) show cross-sectional views of the VIII—VIII section of FIG. 7. In these diagrams, the cross-sectional shape of the lens 42 is semicircular. However, the shape of the lens 42 here does not have to be semicircular provided that it is capable of converging sunlight 26 for the solar cell 12 provided directly below the lens 42.

As FIG. 8(a) shows, when sunlight 26 enters from directly above, a certain amount of sunlight 26 is converged by the lens 42, sunlight 26 is further converged by the water constituting the cooling medium 18 filled within the transparent cooling tube 10 and finally sunlight 26 is gathered on the solar cell 12 positioned directly below the lens 42.

Alternatively, when sunlight 26 enters from the upper right direction, the position detecting sensor 24 provided on the surface of the lower half of the transparent cooling tube 10 detects the movement of the sunlight converging position. Based on the sunlight converging position, the motor 14 rotates the solar cell 12 and lens 42 and the solar cell 12 moves to the sunlight converging position.

As explained above, a special liquid is not required as the cooling medium 18 in the present embodiment. Common water can be used, thereby reducing costs. Also, in the present embodiment, water constituting the cooling medium 18 directly cools the surface of the solar cell 12.

Furthermore, the present embodiment is configured so that the solar cell 12 and lens 42 are moved together by the motor 14 and crank 16, but if sunlight 26 is to be converged above the solar cell 12, the configuration can be revised so that the lens 42 is secured and only the solar cell 12 is moved.

In the first and second embodiments, a cooling medium 18 was filled inside the transparent cooling tube 10, but this cooling medium can also be circulated by circulating means not shown in the diagrams. This would enable the cooling medium 18 to be maintained at a fixed temperature, thereby further improving the cooling of the solar cell 12.

Embodiment 3

When installing a tracking-type solar module of the present invention, there are cases in which it is impossible to align the long axis direction of the transparent cooling tube 10 with north and south or east and west due to constraints and such like concerning the positioning of the module. In such cases, sunlight may cut diagonally across the transparent cooling tube 10.

FIG. 9 depicts this state. In this diagram, a plurality of transparent cooling tubes 10 are arranged in parallel and when the long axis direction of these transparent cooling tubes 10 is positioned in alignment with north and south, the sun moves along the direction of the line indicated with symbol A. In this case, the sun's position can be tracked using a tracking-type solar module as explained above in the first and second embodiments. However, when the long axis direction of the transparent cooling tubes 10 is installed at a specific angle of deviation from the north and south directions, the sun will move in a direction indicated by B at a specific angle of deviation from the direction indicated by A, which intersects the long axis direction of the transparent cooling tubes 10 at a right angle. It is therefore necessary to align the solar cell to the movement of the sun by moving the solar cell to a specific angle of deviation from the long axis direction of the transparent cooling tubes 10.

Figure 10:
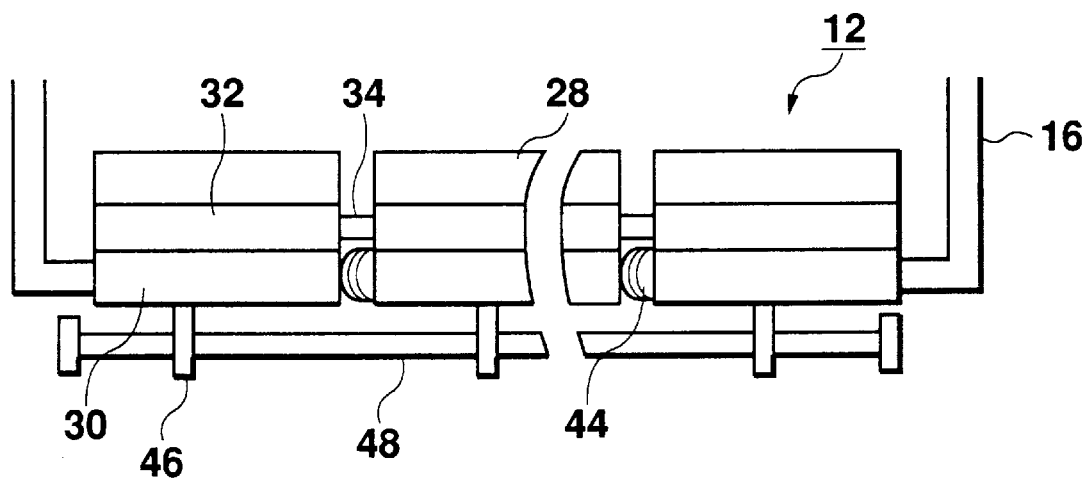
FIG. 10 is a side view of a configuration of a third embodiment of a tracking-type solar module of the present invention.

FIG. 10 shows a side view of solar cell 12 of a tracking-type solar module according to the present embodiment. In this diagram, the solar cell 12 is divided into a plurality of blocks each of which has the same structure as the solar cell 12 depicted in FIG. 4. These solar cell 12 blocks are connected by springs 44. In addition, a ring 46 is provided to each of the support boards 30 of the blocks and a support rod 48 is inserted through these rings 46, thereby providing support to ensure that none of the solar cell 12 blocks deviate up or down.

Figure 11:
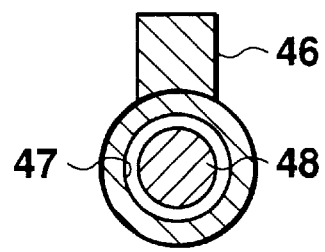
FIG. 11 is a diagram showing a cross-sectional view of a ring and support rod for the tracking-type solar module depicted in FIG. 10.

FIG. 11 depicts a cross-sectional view of a support rod 48 inserted through a ring 46 as described above. The diameter of the hole 47 in the ring 46 is greater than the diameter of the support rod 48 so that the support rod 48 can to a certain extent move freely within the hole 47 in the ring 46.

Figure 12:
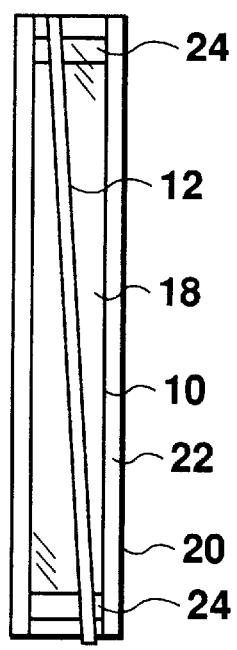
FIG. 12 is a top view of a transparent cooling tube of the tracking-type solar module depicted in FIG. 10.

FIG. 12 shows a top view of a transparent cooling tube 10 of the tracking-type solar module of the present embodiment. In this diagram, two position detecting sensors 24 are provided, one near each end of the transparent cooling tube 10. Consequently, even when the sun moves in a direction which is diagonal to the right angle direction and the long axis of the transparent cooling tube 10 thereby causing the sunlight-converging positions at both ends of the transparent cooling tube 10 to deviate from one another, these positions can be detected. A control portion not shown in the diagram now controls drive motors provided at each end of the transparent cooling tube 10 to align both ends of the solar cell 12 with the respective sunlight-converging positions detected by the position detecting sensors 24. As a result, the solar cell 12 moves to a position at a specific angle of deviation from the long axis of the transparent cooling tube 10 as depicted in FIG. 12. The configuration described above can also be applied to a case in which the long axis of the transparent cooling tube 10 is positioned at a specific angle of deviation from the east-west direction.

The solar cell 12 is divided into a plurality of blocks which are connected to each other by springs 44 as FIG. 10 shows. Consequently, deviation can also be compensated when the angle of the solar cell 12 meets that of the transparent cooling tube 10. Therefore, it is also possible to position the entire solar cell 12 at a specific angle to the long axis of the transparent cooling tube 10.

According to the above configuration, the sun can be accurately tracked without having to align the long axis of the tracking-type solar module to the north-south or east-west directions.

Embodiment 4

Figure 13:
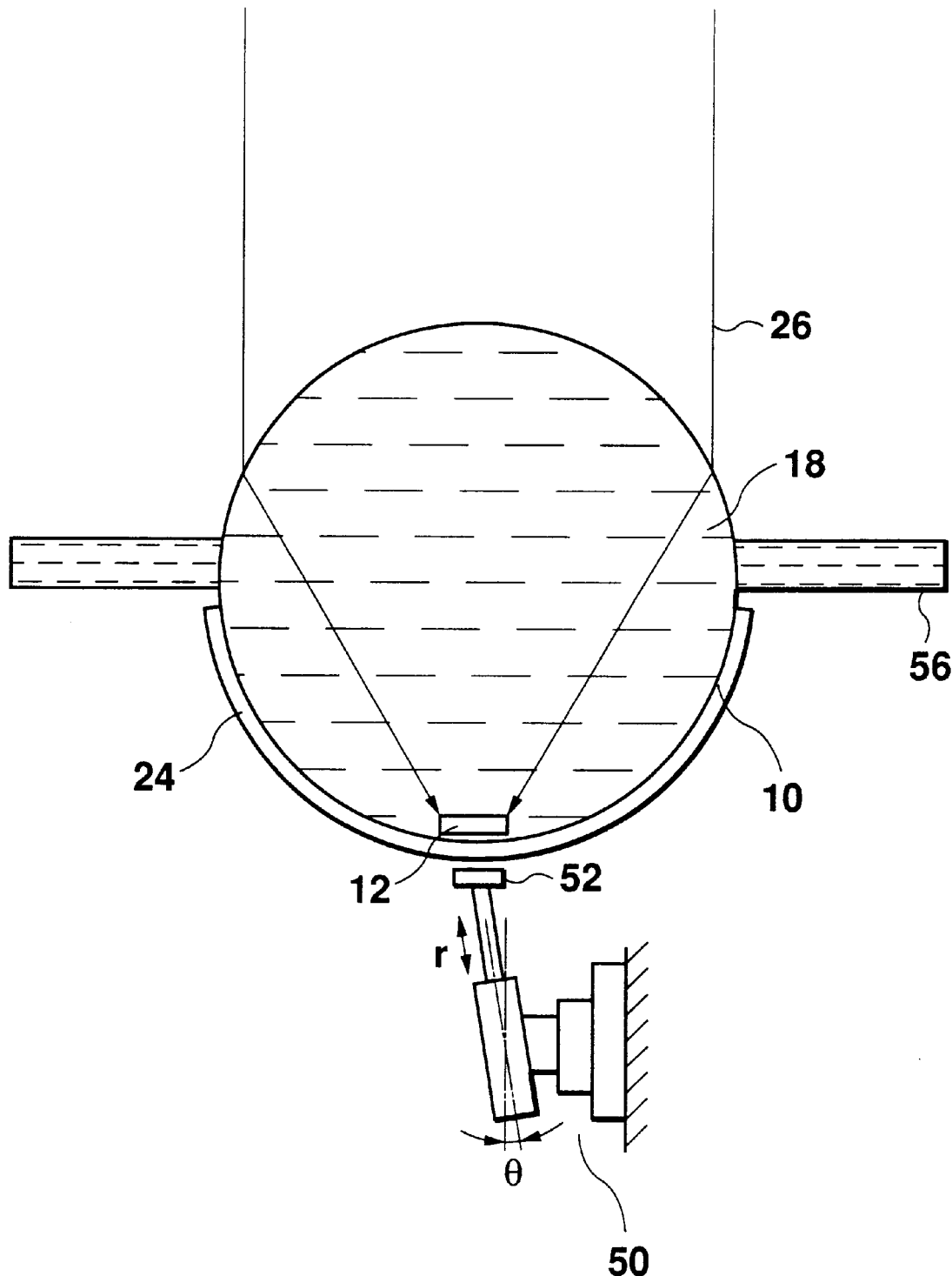
FIG. 13 is a cross-sectional view of a configuration of a fourth embodiment of a tracking-type solar module of the present invention.

FIG. 13 shows a cross-sectional view of a fourth embodiment of a tracking-type solar module of the present invention. In this diagram, the transparent cooling tube 10 is spherical and light-converging can consequently be executed even more efficiently than with a cylindrical transparent cooling tube.

In the present embodiment, a circular solar cell 12 is used since the focal point of the sunlight 26 is a circular spot. The cross-sectional structure of this solar cell 12 is identical to that shown in FIG. 4.

As in all the embodiments described above, in the present embodiment sunlight 26 is tracked by detecting the position at which sunlight 26 converges with a position detecting sensor 24 and moving the solar cell 12 to that position. The solar cell 12 is moved by providing a magnet 52 to the exterior of the transparent cooling tube 10 and moving this magnet 52 in 3-dimensional directions using for example a polar coordinate-type robot 50.

In the present embodiment, when silicon oil with a refractive index of 1.5 is used as the cooling medium 18, the sunlight 26 conversing position focuses on the spherical surface of the transparent cooling tube 10 and the solar cell 12 should therefore be moved on the inside of this spherical surface.

For instance, when a spherical body with a radius of 150 mm is used as the transparent cooling tube 10 and a circular solar cell with a radius of 15 mm is used as the solar cell 12, a light-converging level of 10 is obtained by calculation; however, by controlling the above-mentioned magnet 52 with a microprocessor-controlled polar coordinate-type robot 50, power generation approximately 80 times greater than that obtained by a plane, non-light-converging solar cell of the same area can be obtained.

In the present embodiment, by circulating the cooling medium 18 with a circulating means 56, the temperature of the cooling medium 18 can be maintained at a fixed level thereby further improving the cooling efficiency of the solar cell 12.

Embodiment 5

In each of the embodiments described above, tracking was executed by detecting the position at which sunlight converges and moving the solar cell 12 to that position, but tracking efficiency can be further improved if the operation functions without error, even when the sky is cloudy and sunlight has been obscured or when it is evening.

Figure 14:
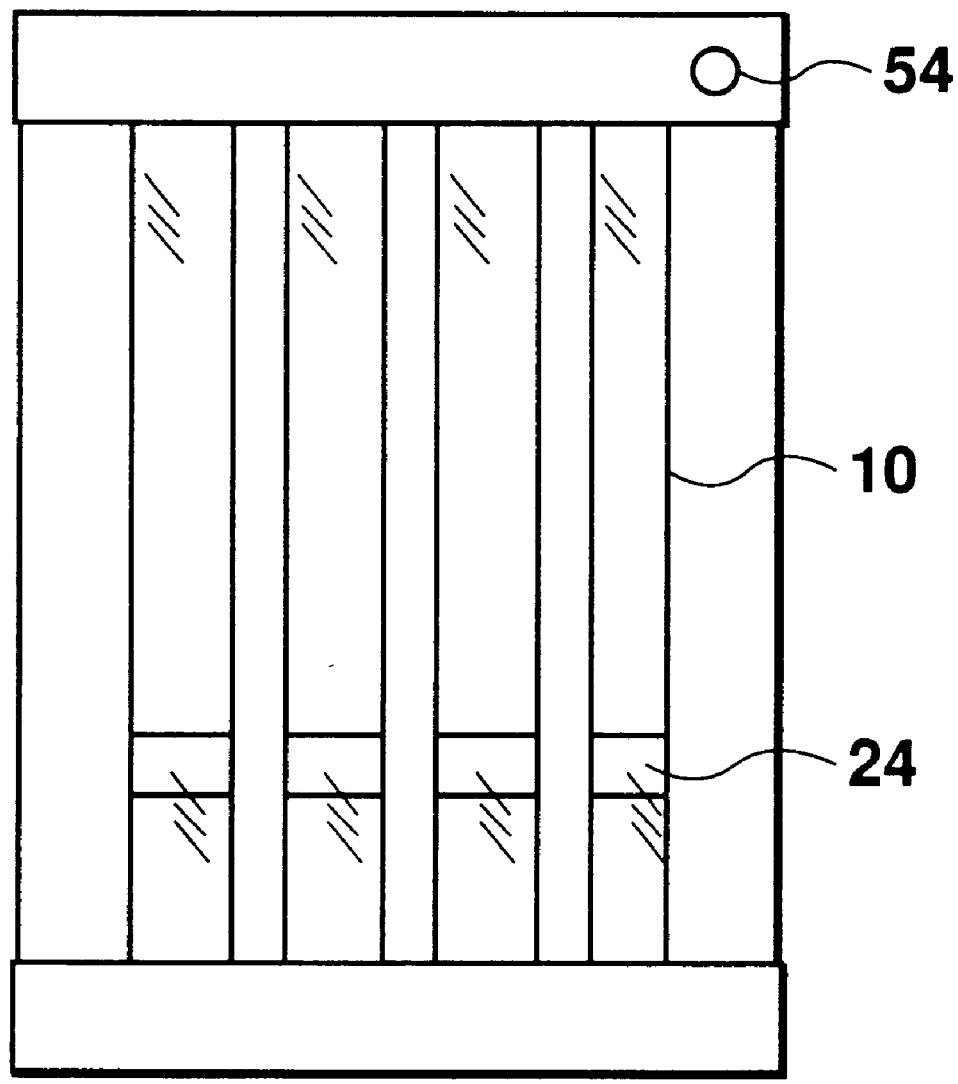
FIG. 14 is a top view of a configuration of a fifth embodiment of a tracking-type solar module of the present invention.

FIG. 14 shows a top view of a tracking-type solar module according to a fifth embodiment. In this diagram, there are 4 transparent cooling tubes 10 to which are provided 4 position detecting sensors 24. It is, however, possible to use only one position detecting sensor 24.

Furthermore, in the present embodiment, a light sensor 54 for detecting whether it is now morning or evening, or whether the sky is cloudy, is provided on the outside of the transparent cooling tube 10 in addition to the position detecting sensors 24. The position detecting sensors 24 and the light sensor 54 constitute a discriminating means for discriminating the start of tracking operations.

With the above configuration it is possible to distinguish among morning, evening and cloud conditions and an appropriate sunlight tracking operation can be performed in accordance with any of these states.

Figure 15:
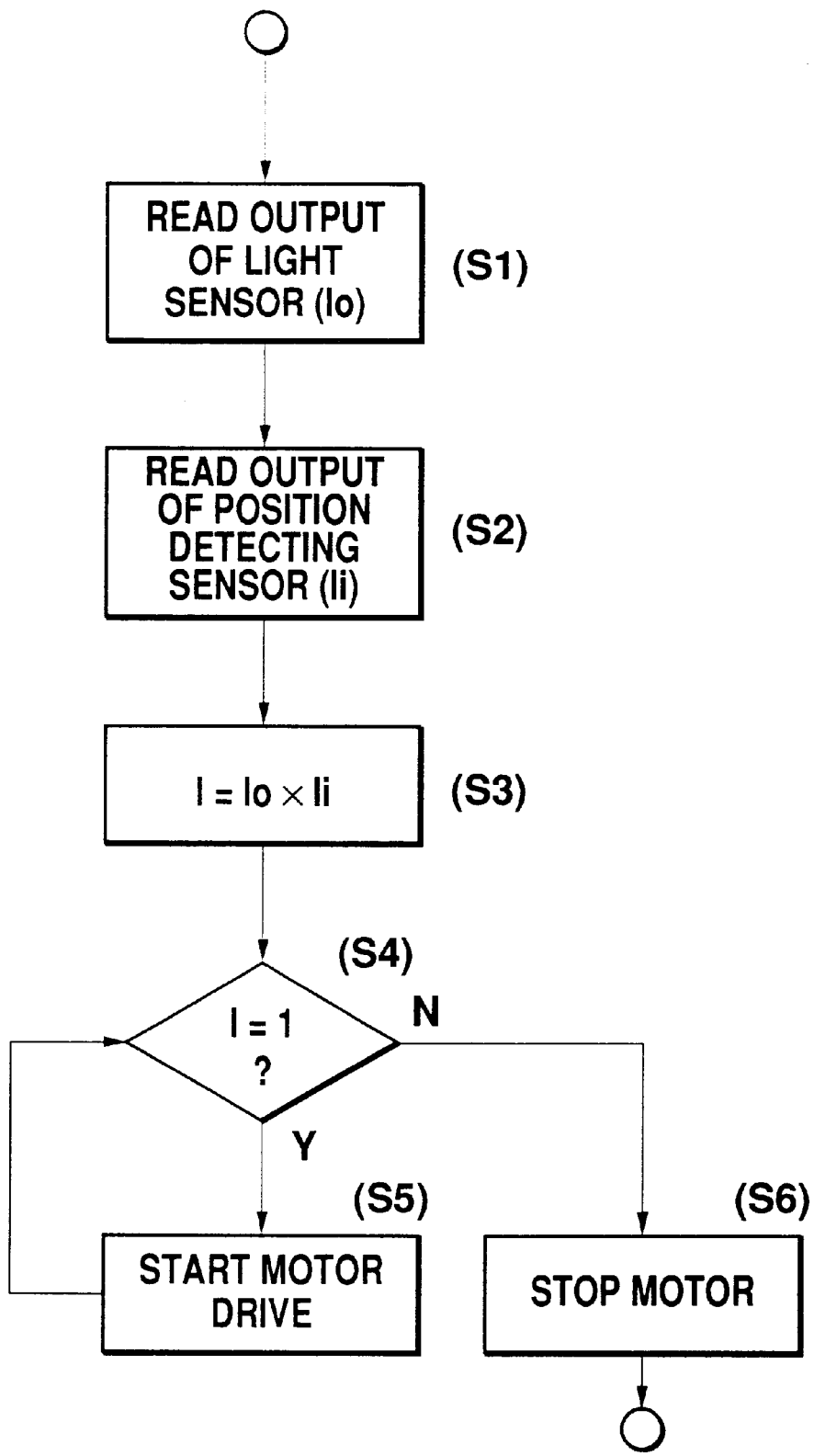
FIG. 15 is a flowchart showing control of the tracking-type solar module depicted in FIG. 14.
Figure 16:
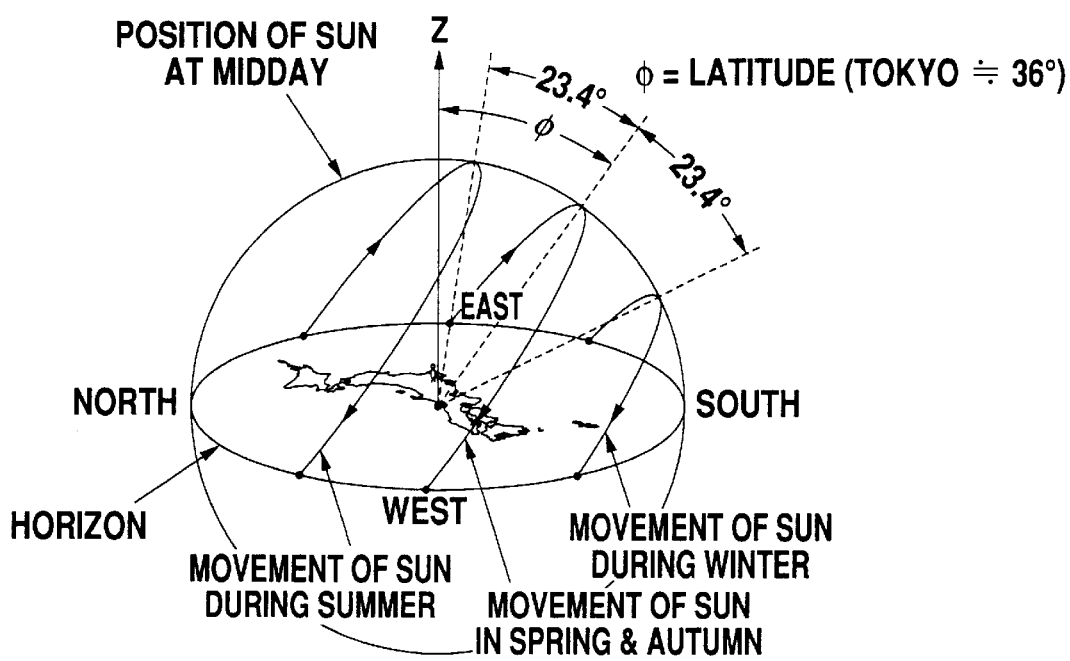
FIG. 16 is a diagram explaining the movement of the sun during each season.

FIG. 15 shows the position control flowchart for a solar cell 10 in the present embodiment. In FIG. 15, a sunlight detection output Io is read out from the light sensor 54. The embodiment here is configured so that the value of Io is 1 when the strength of the sunlight exceeds a predetermined threshold and Io is 0 when sunlight strength is less than the threshold. This threshold is set so that the detection output Io of the light sensor 54 is 0 only at nighttime (S1).

Next, a sunlight detection output Ii is read out from the position detecting sensor 24. Here too, the value of Ii is 1 when the strength of the sunlight exceeds a predetermined threshold and is 0 when sunlight strength is less than the threshold. This threshold is set so that the detection output Ii of the position detecting sensor 24 is 0 in the morning, evening, at night or during cloudy weather, and so that Ii is 1 when sunlight converged during clear weather has struck the solar cell 12. Since the position detecting sensor 24 is contained within the transparent cooling tube 10, it has less light-receiving strength than the light sensor 54 even when exposed to the same level of sunlight. Therefore, threshold for the light sensor 54 and the position detecting sensor 24 can be identical (S2).

Next, the calculation I=Io×Ii is worked out using the output Io of the light sensor 54 and the detection output Ii of the position detecting sensor 24. The value thus calculated becomes the output of the above-mentioned discriminating means (S3).

It is next determined whether or not I=1 (S4).

When I=1 at S4, since sunlight is here being detected at both the light sensor 54 and the position detecting sensor 24, this indicates that sunlight is not being diminished due to time of day (morning, evening, nighttime) or weather conditions (cloud) but that strong sunlight has been converged and is striking the solar cell 12 and therefore the motor for moving the solar cell 12 commences driving (S5).

Alternatively, when I is not 1 at S4, this is because both Io and Ii are 0 since it is now night, or because only Ii is 0 since it is now morning, evening or cloudy and sunlight is consequently being weakened. In such conditions, control cannot be carried out correctly if the solar cell 12 is moved and therefore the motor which moves the solar cell 12 is stopped (S6).

As explained above, since according to the present invention the cooling medium both cools the solar cell and functions as a lens, a highly efficient tracking-type solar module can be obtained with a simple configuration.

In addition, since the cooling medium directly cools the solar cell, cooling efficiency can be increased, light-converging level can be improved and increased power generating efficiency can be obtained, while cost can be reduced.

Water can also be used as the cooling medium thereby further reducing costs.

Furthermore, when the cooling tube is positioned at a diagonal to the sun's orbit, the solar cell can also be moved to a diagonal position, thereby increasing sunlight-converging efficiency.

Furthermore, since controlling methods suitable for operation in the morning, evening, at night or during cloudy weather can be applied, the solar cell system can be completely automated.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A tracking solar module for generating power while tracking the sun comprising:

a transparent cooling tube permeable to sunlight;

a solar cell movably installed inside the transparent cooling tube;

a cooling medium contained within the transparent cooling tube for directly cooling the solar cell while also functioning as a lens for converging sunlight and having a refractive index such that sunlight is converged inside the transparent cooling tube;

a position detecting sensor for detecting the position of sunlight converged by the cooling medium; and a driving device for moving the solar cell to the sunlight-converging position in accordance with a signal from the position detecting sensor.

2. A tracking solar module according to claim 1, wherein the transparent cooling tube is cylindrical.

3. A tracking solar module according to claim 1, wherein the transparent cooling tube is spherical.

4. A tracking solar module according to claim 1, wherein a lens is installed within the transparent cooling tube and the refractive index of the cooling medium is combined with the lens so that sunlight is converged inside the transparent cooling tube.

5. A tracking solar module according to claim 2, wherein the solar cell is arranged in the axial direction of the transparent cooling tube and can be placed at a designated angle with the axis of the transparent cooling tube.

6. A tracking solar module according to claim 3, wherein a driving device has a magnet positioned on the outside of the transparent cooling tube and the solar cell is moved to a sunlight-converging position by movement of the magnet.

7. A tracking solar module according to claim 1, further comprising a light sensor on the outside of the transparent cooling tube wherein, based on the amount of light received by the light sensor and the amount of light received by the position detecting sensor, sunlight is tracked only when the amount of sunlight exceeds a designated amount.

* * * * *